United States Patent
Srivastava

(10) Patent No.: US 11,372,622 B2
(45) Date of Patent: Jun. 28, 2022

(54) TIME-SHARED COMPUTE-IN-MEMORY BITCELL

(71) Applicant: QUALCOMM Incorporated, San Diego, CA (US)

(72) Inventor: Ankit Srivastava, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 363 days.

(21) Appl. No.: 16/811,480

(22) Filed: Mar. 6, 2020

(65) Prior Publication Data

US 2021/0279039 A1  Sep. 9, 2021

(51) Int. Cl.
| | |
|---|---|
| *G06F 7/57* | (2006.01) |
| *G11C 11/41* | (2006.01) |
| *G11C 11/412* | (2006.01) |
| *G11C 11/419* | (2006.01) |
| *G06N 20/00* | (2019.01) |
| *H03M 1/38* | (2006.01) |

(52) U.S. Cl.
CPC .............. *G06F 7/57* (2013.01); *G11C 11/412* (2013.01); *G11C 11/419* (2013.01); *G06N 20/00* (2019.01); *H03M 1/38* (2013.01)

(58) Field of Classification Search
CPC ....... G06F 7/57; G11C 11/412; G11C 11/419; G11C 7/1006; G11C 11/54; G06N 20/00; H03M 1/38; H01L 27/0207; H01L 27/1104
See application file for complete search history.

(56) References Cited

U.S. PATENT DOCUMENTS

| | | | |
|---|---|---|---|
| 10,381,071 B1 | 8/2019 | Si et al. | |
| 2017/0117034 A1* | 4/2017 | Hebig | ................... G11C 11/419 |
| 2019/0103156 A1 | 4/2019 | Sumbul et al. | |
| 2021/0158854 A1* | 5/2021 | Sinangil | .............. G11C 11/4093 |

OTHER PUBLICATIONS

A. Agrawal, A. Jaiswal, C. Lee and K. Roy, "X-SRAM: Enabling In-Memory Boolean Computations in CMOS Static Random Access Memories," in IEEE Transactions on Circuits and Systems I: Regular Papers, vol. 65, No. 12, pp. 4219-4232, Dec. 2018, doi: 10.1109/TCSI.2018.2848999. (Year: 2018).*
International Search Report and Written Opinion—PCT/US2021/020862—ISA/EPO—dated Jun. 7, 2021.

* cited by examiner

Primary Examiner — Ajay Ojha
(74) Attorney, Agent, or Firm — Qualcomm Incorporated

(57) ABSTRACT

A compute-in-memory array is provided that includes a set of compute-in-memory bitcells that time share a shared capacitor connected between the set of compute-in-memory bitcells and a read bit line.

24 Claims, 9 Drawing Sheets in a first bitcell, controlling a first pair of transmission gates to drive a second plate of a shared capacitor with a first multiplication signal responsive to a first multiplication of a first input bit with a first stored bit, the shared capacitor having a first plate connected to a read bit line ~400 sampling a first charge of the read bit line while grounding the second plate of the shared capacitor after the first multiplication to provide a first sampled charge of the read bit line ~405 in a second bitcell, controlling a second pair of transmission gates to drive the second plate of the shared capacitor with a second multiplication signal responsive to a second multiplication of a second input bit with a second stored bit sampling a second charge of the read bit line while grounding the second plate of the shared capacitor after the second to provide a second sampled charge of the read bit line ~415

FIG. 4

TIME-SHARED COMPUTE-IN-MEMORY BITCELL

TECHNICAL FIELD

This application relates to compute-in-memories, and more particularly to a time-shared compute-in-memory bitcell.

BACKGROUND

Computer processing of data typically uses a Von Neumann architecture in which the data is retrieved from a memory to be processed in an arithmetic and logic unit. In computation-intensive applications such as machine learning, the data flow from and to the memory becomes a bottleneck for processing speed. To address this data-movement bottleneck, compute-in-memory architectures have been developed in which the data processing hardware is distributed across the bitcells.

SUMMARY

In accordance with a first aspect of the disclosure, a compute-in-memory bitcell array is provided that includes: a read bit line; a shared capacitor having a first plate connected to the read bit line; a first compute in-memory bitcell that includes a first pair of cross-coupled inverters having a first output node for a first stored bit and includes a first transmission gate connected between the first output node and a second plate of the shared capacitor, the first transmission gate being configured to close in response to a first input bit being true and to open in response to the first input bit being false; and a second compute in-memory bitcell that includes a second pair of cross-coupled inverters having a second output node for a second stored bit and includes a second transmission gate connected between the second output node and the second plate of the shared capacitor, the second transmission gate being configured to close in response to a second input bit being true and to open in response to the second input bit being false.

In accordance with a second aspect of the disclosure, a compute-in-memory method is provided that includes: in a first bitcell, controlling a first pair of transmission gates to drive a second plate of a shared capacitor with a first multiplication signal responsive to a first multiplication of a first input bit with a first stored bit, the shared capacitor having a first plate connected to a read bit line; sampling a first charge of the read bit line while grounding the second plate of the shared capacitor after the first multiplication to provide a first sampled charge of the read bit line; in a second bitcell, controlling a second pair of transmission gates to drive the second plate of the shared capacitor with a second multiplication signal responsive to a second multiplication of a second input bit with a second stored bit; and sampling a second charge of the read bit line while grounding the second plate of the shared capacitor after the second multiplication to provide a second sampled charge of the read bit line In accordance with a third aspect of the disclosure, a compute-in-memory circuit is provided that includes: a read bit line; a first shared capacitor having a first plate connected to the read bit line; a second shared capacitor having a first plate connected to the read bit line; a first set of compute-in-memory bitcells, each compute-in-memory bitcell in the first set having a first output node connected to a second plate of the first shared capacitor; and a second set of compute-in-memory bitcells, each compute-in-memory bitcell in the second set having a second output node connected to a second plate of the second shared capacitor.

These and other advantageous features may be better appreciated through the following detailed description.

BRIEF DESCRIPTION OF THE DRAWINGS

FIG. 4 is a flowchart for an example compute-in-memory method in accordance with an aspect of the disclosure.

Embodiments of the present disclosure and their advantages are best understood by referring to the detailed description that follows. It should be appreciated that like reference numerals are used to identify like elements illustrated in one or more of the figures.

DETAILED DESCRIPTION

Figure 1A:
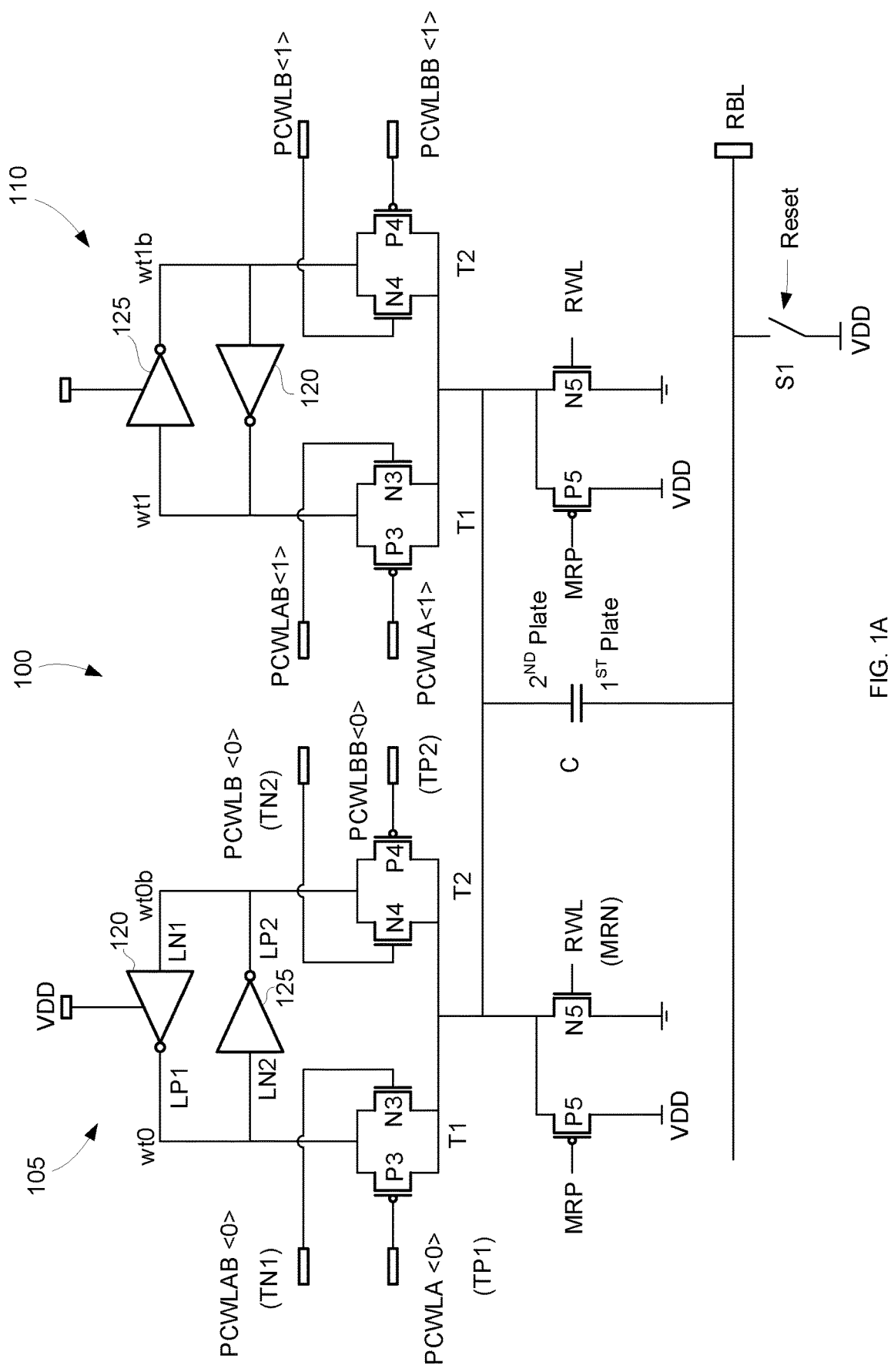
FIG. 1A illustrates a first pair of compute-in-memory bitcells time sharing a shared capacitor in accordance with an aspect of the disclosure.

A compute-in-memory storage cell such as a compute-in-memory bitcell is provided that includes an SRAM cell that stores a bit using two cross-coupled inverters. One of the cross-coupled inverters drives a true (Q) output node with the stored bit whereas the remaining cross-coupled inverter drives a complement (QB) output node with a complement of the stored bit. The compute-in-memory bitcell also includes a shared capacitor having a first plate connected to a read bit line (RBL). As used herein, "connected" refers to a direct electrical connection although such a direct connection may be accomplished through an intervening element such as a resistor, a capacitor, or an inductor. The Q output node couples to a second plate of the shared capacitor through a first transmission gate. Similarly, the QB output node couples to the second plate of the shared capacitor through a second transmission gate. The Q output node is also denoted herein as a first output node. Similarly, the QB output node is also denoted herein as a second output node. An input vector bit (which is typically denoted as an activation bit in the machine learning arts in an analogy to a biological neuron) controls whether the first and second transmission gates are open and closed. This control by the activation bit is complementary such that if the activation bit is true, one of the transmission gates is open but the remaining one of the transmission gates is closed. If the activation bit is false, then the open and closed states for the transmission gates is reversed from the true activation bit state configuration.

The second plate for the shared capacitor couples to ground through a reset transistor such as an n-type metal-oxide semiconductor (NMOS) reset transistor having a gate controlled by a read word line (RWL). During a reset phase for the compute-in-memory bitcell, the read bit line is charged high to a power supply voltage VDD while the read word line is asserted to the power supply voltage VDD to charge the shared capacitor while the first transmission gate and the second transmission gate are both opened. During a calculation phase following the reset phase, the read word line is discharged to switch off the reset transistor while the read bit line remains charged to the power supply voltage VDD. If the activation bit and the stored bit are both true, the first transmission gate is switched on to charge the second plate of the shared capacitor to the power supply voltage VDD. Similarly, if the activation bit and the stored bit are both false, the second transmission gate is switched on to charge the second plate of the shared capacitor. Since the first plate of the shared capacitor remains connected to a power supply node for the power supply voltage VDD during the calculation phase, the charging of the second plate to the power supply voltage VDD discharges the shared capacitor. On the other hand, if the input vector bit and the stored bit have complementary values, the second plate of the shared capacitor remains discharged so that the capacitor remains charged to the power supply voltage VDD.

Should the activation bit be an active-low signal, the compute-in-memory bitcell is then implementing an exclusive not-OR (XNOR) operation of the activation bit and the stored bit during the calculation phase in that a logical true output (capacitor remaining charged) is obtained if both the activation bit and the stored bit have the same binary value whereas a logical false output (capacitor discharged) is obtained if the activation bit and the stored bit do not have the same binary value. If the activation bit was instead an active-high signal, the compute-in-memory bitcell would implement an exclusive-OR (XOR) operation of the stored bit and the input vector bit.

The resulting compute-in-memory bitcell is quite advantageous since the resulting charging of the shared capacitor is full-rail (i.e, either charged to the power supply voltage VDD or discharged to ground). Moreover, the read word line assertion to switch on the reset transistor does not need to be boosted above the power supply voltage VDD for the resulting rail-to-rail output. Finally, the reset transistor as well as the remaining transistors in the compute-in-memory bitcell may all be high-voltage (thick-oxide) transistors to limit leakage. Some example compute-in-memory bitcells will now be discussed in more detail. Although such a compute-in-memory SRAM bitcell architecture is advantageous, it is not as dense as a traditional six-transistor SRAM bitcell. In particular, note that a traditional six-transistor SRAM bitcell can be laid out on a semiconductor die using a four polysilicon (poly) line pitch. In other words, a conventional six-transistor SRAM bitcell occupies a die space (semiconductor substrate portion) spanning across four consecutive polysilicon lines (poly lines). But a conventional compute-in-memory SRAM bitcell requires five poly lines for its implementation on a semiconductor die. In addition, the capacitor for such a traditional compute-in-memory SRAM bitcell is a metal-layer capacitor such that the first plate is formed in one metal layer adjacent the semiconductor die. Similarly, the second plate for the capacitor is formed in another metal layer. Although the transistors in the bitcell reduce in size as the modern process nodes, there is a certain amount of capacitance that the capacitor needs to satisfy (e.g., a third of a femto-Farad) such that the capacitor requires a corresponding amount of die space that cannot be reduced.

To solve the poly-pitch and capacitor die-space constraints for a compute-in-memory SRAM bitcell architecture, a time-sharing approach is introduced. As implied by the term "time-sharing," this approach time-shares the shared capacitor across multiple bitcells. This sharing may be between just two bitcells or may be across greater than two bitcells. As the number of bitcells sharing the shared capacitor is increased, latency for the calculation phase also increases. With regard to this parallel architecture, note that it is conventional in deep learning applications to multiply various activation bits and corresponding stored weight bits in a convolution operation typically denoted as a "filter." A filter will thus include a plurality of compute-in-memory bitcells for the multiplications of the corresponding activations (input bits) and the stored weight bits. The time-shared bitcell architecture disclosed herein is readily organized into multiple filters (e.g., 128 filters) that are processed in parallel. The increased latency of the time-shared use of a single shared capacitor by multiple compute-in-memory bitcells is thus offset by the massively parallel architecture of typical machine learning applications.

Turning now to the drawings, an example pair 100 of compute-in-memory SRAM bitcells is shown in FIG. 1A. A shared capacitor C is time shared by a compute-in-memory SRAM bitcell 105 and a compute-in-memory SRAM bitcell 110. Each bitcell 105 and 110 includes a pair of cross-coupled inverters 120 and 125 that stores a weight bit. Bitcell 105 stores a zeroth weight bit (wt0) and its complement wt0*b* whereas bitcell 110 stores a first weight bit (wt1) and its complement wt1*b*. In each bitcell, the weight bit couples through a first transmission gate T1 to a second plate of the shared capacitor C. A first plate of the shared capacitor C connects to a read bit line (RBL). A p-type metal-oxide semiconductor (PMOS) transistor P3 in parallel with an n-type metal-oxide semiconductor (NMOS) transistor N3 forms each first transmission gate T1. Similarly, the complement weight bit in each bitcell couples through a second transmission gate T2 to the second plate of the shared capacitor. A PMOS transistor P4 in parallel with an NMOS transistor N4 forms each second transmission gate T2.

In each bitcell 105 and 110, an NMOS reset transistor N5 has a source connected to ground and a drain connected to the second plate of the shared capacitor C. A read word line RWL connects to a gate of each reset transistor N5. Prior to a calculation phase, the shared capacitor C is reset in a reset phase for bitcells 105 and 110. During the reset phase, a reset signal carried on a reset line is asserted to close a reset switch S1 connected between the read bit line and a node for a power supply voltage VDD. The read bit line is thus charged to the power supply voltage VDD during the reset phase. While the reset signal is asserted, the read word line is also asserted to the power supply voltage VDD so that each reset transistor N5 switches on to ground the second plate of shared capacitor C. The shared capacitor C is thus charged to the power supply voltage VDD during the reset phase. During this reset phase, all the transmission gates T1 and T2 are opened.

Each bitcell 105 and 110 has its own calculation phase following the reset phase. In each calculation phase, an activation bit for the bitcell that is active in the calculation phase controls the bitcell's transmission gates. For example, a zeroth activation bit controls transmission gates T1 and T2 in bitcell 105. The zeroth activation bit controls a zeroth pre-charge word line PCWLA<0> that drives a gate of transistor P3 in first transmission gate T1 in bitcell 105. The complement of the zeroth activation bit controls a zeroth pre-charge complement word line PCWLAB<0> that drives a gate of transistor N3 in that same first transmission gate T1. The read word line is de-asserted during the calculation phase so that the second plate of the shared capacitor C floats with respect to ground. Which transmission gate is opened or closed in bitcells 105 and 110 during its calculation phase depends upon whether the corresponding activation bits are active-low or active-high. In an active-low embodiment, the zeroth pre-charge word line PCWLA<0> is discharged if the zeroth activation bit is true. At the same time, the zeroth pre-charge complement word line PCWLAB<0> is then charged high to the power supply voltage VDD. Both transistors P3 and N3 in the first transmission gate T1 in bitcell 105 will thus be switched on such that this first transmission gate T1 is closed to connect the node for the zeroth weight bit wt0 to the second plate of the shared capacitor C. If the zeroth weight wt0 is true, the second plate of the shared capacitor C will thus be charged to the power supply voltage VDD to discharge the shared capacitor C.

The control of the second transmission gate T2 in bitcell 105 is complementary since the zeroth activation bit also controls the state of a zeroth pre-charge word line PCLWB<0> that drives a gate of transistor N4. Similarly, the complement of the zeroth activation bit controls a state of a zeroth pre-charge complement word line PCWLBB<0> that drives a gate of transistor P4. If the zeroth weight wt0 is false while the active-low zeroth activation bit is also false, the charged state for the zeroth complement weight bit wtb0 flows through the closed transmission gate T2 in bitcell 105 to charge the second plate of the shared capacitor C to discharge the shared capacitor C. The resulting multiplication of the zeroth weight bit wt0 with the zeroth activation bit is thus an XNOR operation since the second plate of the shared capacitor C will be charged if both these bits have the same binary value. Should these bits be the complements of each other, the second plate of the shared capacitor C remains discharged during the calculation phase. On the other hand, the multiplication would an XOR in bitcell 105 if the zeroth activation bit is an active-high signal.

Prior to the reset phase and the calculation phase, the zeroth weight bit wt0 is written into bitcell 105 in a write phase. During the write phase, the read word line is asserted to ground the second plate of the shared capacitor. Depending upon the value of the zeroth weight bit wt0, one of the transmission gates T1 and T2 is switched on (closed) while the other one of the transmission gates is switched off (opened). For example, if the zeroth weight bit wt0 is a binary one, it is transmission gate T2 that is switched on. The ground through reset transistor N5 then flows through transmission gate T2 to drive the input to inverter 120, which then asserts its output node to VDD to latch the binary-high state for the zeroth weight bit wt0. Conversely, should the binary weight bit wt0 be a binary zero, it is transmission gate T1 that is switched on. The ground through reset transistor N5 then flows through transmission gate T1 to drive the input node for inverter 125. The complement zeroth weight bit wt0b is thus driven high to the power supply voltage VDD to latch the binary zero into bitcell 105. Transmission gates T1 and T2 are thus controlled in a complementary fashion during both the write phase and the calculation phase. But both of these transmission gates are switched off during the reset phase so that the grounding of the second capacitor plate while the shared capacitor C is charged does not disturb the stored state for the stored weight bit.

In bitcell 110, a first activation bit controls a first pre-charge word line PCWLA<1> and a first pre-charge complement word line PCWLAB<1> in an analogous fashion to control its transmission gate T1. Similarly, the first activation bit controls a first pre-charge word line PCWLB<1> and a first pre-charge complement word line PCWLBB<1> to control the transmission gate T2 in bitcell 110. But the calculation phase in bitcell 105 and bitcell 110 are staggered or time multiplexed such that a first one of the bitcells performs its calculation phase and then the other bitcell performs its calculation phase. Each of these calculation phases is followed by its own accumulation phase. In each accumulation phase, the read word line is asserted while the reset signal is de-asserted. The read bit line is thus isolated during the accumulation phase from the power supply node because it isolated from the power supply node by the de-assertion of the reset signal. The second plate of the shared capacitor C is grounded during the accumulation phase as transistors N5 are switched on due to the assertion of the read word line to the power supply voltage VDD. A reset phase for bitcells 105 and 110 may thus be followed by a calculation/accumulation phase for one of the bitcells followed by a calculation/accumulation phase for a remaining one of the bitcells.

Figure 1B:
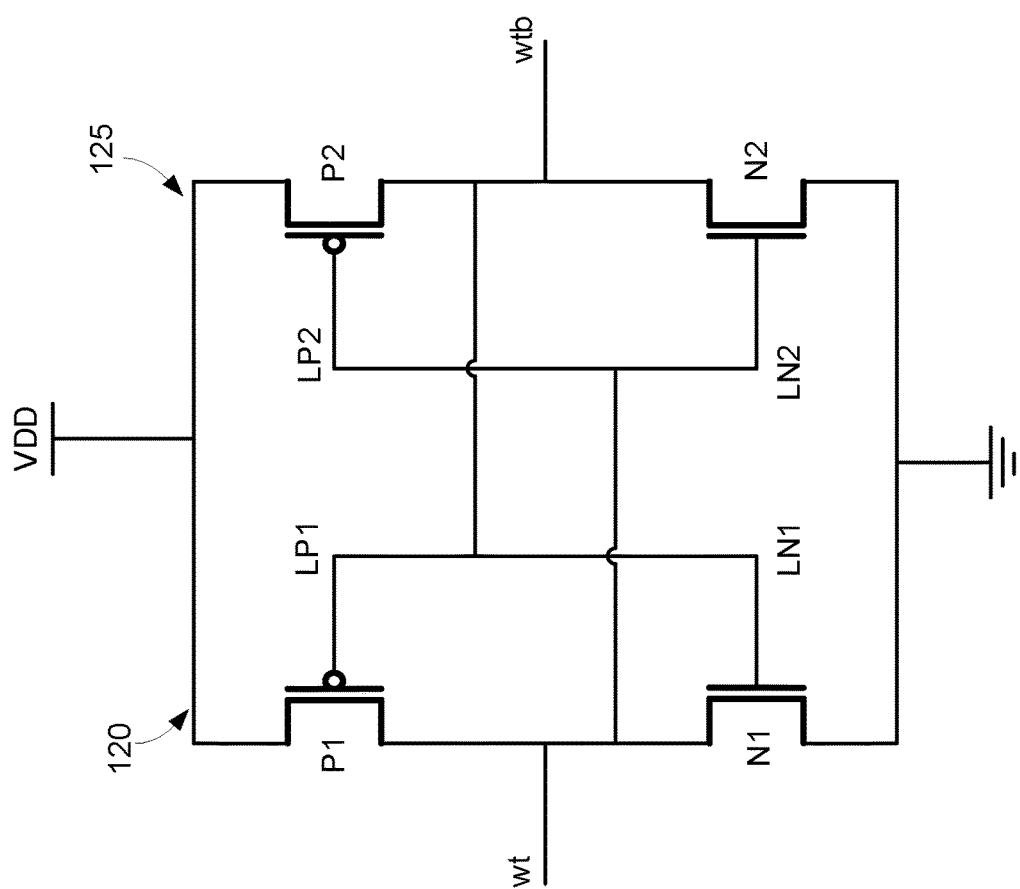
FIG. 1B is a circuit diagram for a pair of cross-coupled inverters in either of the compute-in-memory bitcells of FIG. 1A in accordance with an aspect of the disclosure.

Cross-coupled inverters 120 and 125 for bitcells 105 and 110 are shown in more detail in FIG. 1B. Each inverter is formed by a p-type metal-oxide-semiconductor (PMOS) transistor in series with an n-type metal-oxide-semiconductor (NMOS) transistor. For example, inverter 120 is formed by a PMOS transistor P1 in series with an NMOS transistor N1. A source of transistor N1 connects to ground whereas a drain of transistor N1 connects to a drain of transistor P1. A source of transistor P1 connects to a power supply node. The drains of transistor P1 and N1 form an output node for inverter 120 over which inverter 120 drives a weight bit wt. Since inverter 120 in FIG. 1B is generic to either of bitcells 105 or 110, weight bit wt is not given a zeroth or first index in FIG. 1B. Inverter 125 is analogous in that it is formed by a PMOS transistor P2 in series with an NMOS transistor N2. A source of transistor N2 connects to ground whereas a drain of transistor N2 connects to a drain of transistor P2. A source of transistor P2 connects to the power supply node. The drains of transistor P2 and N2 form an output node for inverter 125 over which inverter 125 drives a complement weight bit wtb. To complete the cross-coupling, the output node of inverter 120 connects to the gates for transistors N2 and P2 whereas the output node of inverter 125 connects to the gate for transistors N1 and P1.

Figure 1C:
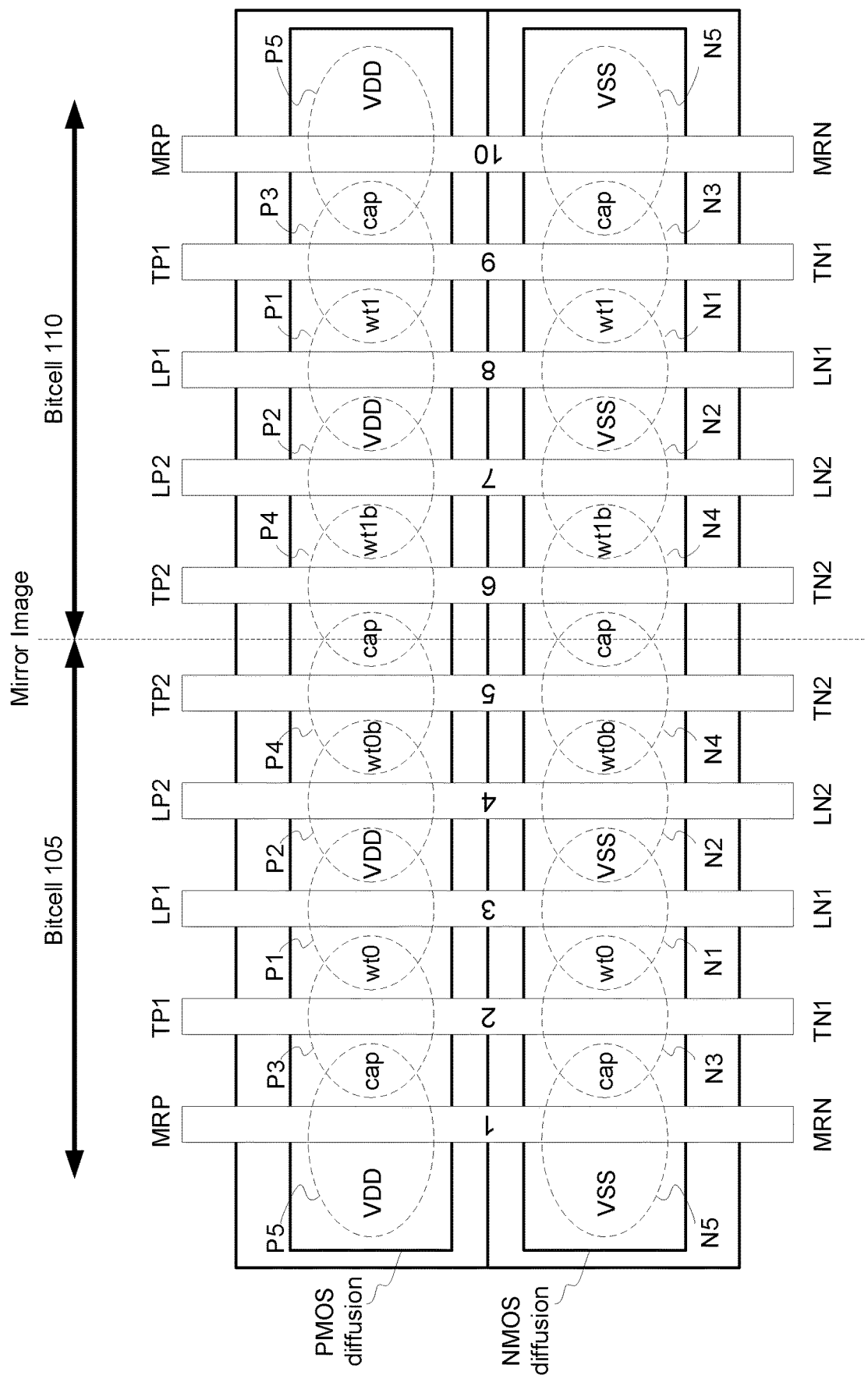
FIG. 1C illustrates a semiconductor layout for the first pair of compute-in-memory bitcells of FIG. 1A in accordance with an aspect of the disclosure.

Each bitcell 105 and 110 thus includes its own transistors N1, P1, N2, P2, N3, P3, N4, P4, and N5. These transistors may be laid out on a semiconductor substrate within a 5-poly pitch as shown in FIG. 1C. The poly lines for bitcell 105 are numbered from 1 through 5. Similarly, the poly lines for bitcell 110 are numbered from 6 through 10. The PMOS transistors are formed on a PMOS diffusion region whereas the NMOS transistors are formed on an NMOS diffusion region. The intersection of a poly line with the NMOS or PMOS diffusion regions forms a gate for a corresponding NMOS or PMOS transistor. Referring again to FIG. 1B, the gate for transistor P1 in inverter 120 may be labeled as corresponding to a poly gate region LP1. Similarly, the gate for transistor N1 in inverter 120 is labeled as corresponding to a poly gate region LN1. This same nomenclature is used in FIG. 1C. A gate for transistor P1 in bitcell 105 is thus formed by a poly gate region LP1 in poly line 3. A VDD node in the PMOS diffusion region adjacent to poly gate region LP1 forms the source for transistor P2 whereas a weight bit node in the PMOS diffusion region adjacent to poly gate region LP1 forms the drain. In bitcell 105, this weight bit node is the zeroth weight bit node wt0 whereas it is the first weight bit node wt1 in bitcell 110. Transistor N1 for inverter 120 is analogous in that its gate is formed by a poly gate region LN1 in poly line 3 (note that a poly cut that is not shown isolates poly gate regions LP1 and LN1 in poly line 3).

Referring again to FIG. 1B, the gate for transistor P2 in inverter 125 may be labeled as corresponding to a poly gate region LP2. Similarly, the gate for transistor N1 in inverter 120 is labeled as corresponding to a poly gate region LN2. This same nomenclature is again used in FIG. 1C. A gate for transistor P2 is thus formed by a poly gate region LP2 in poly line 4 for bitcell 105. A VDD node in the PMOS diffusion region adjacent to this poly gate region LP2 forms the source for this transistor P2 whereas a complement weight bit node in the PMOS diffusion region adjacent to poly gate region LP2 forms the drain. In bitcell 105, this complement weight bit node is the zeroth complement weight bit node wt0$b$ whereas it is the first complement weight bit node wt1$b$ in bitcell 110. Transistor N2 for inverter 125 is analogous in that its gate is formed by a poly gate region LN2 in poly line 4.

Referring again to FIG. 1A, a gate node for transistor P3 in each first transmission gate T1 may be denoted as TP1. Similarly, a gate node for transistor N3 in each first transmission gate T1 may be denoted as TN1. Poly line 2 for bitcell 105 in FIG. 1C thus forms a corresponding poly gate region TP1 for transistor P3 and forms a corresponding poly gate region TN1 for transistor P3. As seen in FIG. 1A, a gate node for transistor P4 in each second transmission gate T2 may be denoted as TP2 whereas a gate node for each transistor N4 in each second transmission gate T2 may be denoted as TN2. Poly line 4 for bitcell 105 in FIG. 1C thus forms a corresponding poly gate region TP2 for transistor P4 and forms a corresponding poly gate region TN2 for transistor N4.

It may be seen from FIG. 1C that bitcell 110 is the mirror image of bitcell 105. A poly line 6 in bitcell 110 is thus analogous to poly line 5 in bitcell 105, a poly line 7 in bitcell 110 is analogous to poly line 4 in bitcell 105, and so on. Poly lines 2-5 in bitcell 105 thus form the gates for its transistors P1, N1, P2, N2, P3, N3, P4, and N4. Similarly, poly lines 6-9 in bitcell 110 form the gates for its transistors P1, N1, P2, N2, P3, N3, P4, and N4. Note that a similar four-poly pitch can be used to construct a traditional six-transistor SRAM bitcell. In bitcells 105 and 110, reset transistor N5 may thus be deemed as an "orphan" with respect to this four-poly pitch as it cannot fit onto any of poly lines 2-9. In bitcell 105 it is poly line 1 that forms a gate for the corresponding reset transistor N5. As seen in FIG. 1A, a gate node for each reset transistor N5 may be denoted as MRN. There is thus a poly gate region MRN in poly line 1 in FIG. 1C for reset transistor N5 in bitcell 105. A mirror image poly line 10 in bitcell 110 forms a corresponding poly gate region MRN for its reset transistor N5.

Since each reset transistor N5 requires its own corresponding poly line, that same poly line will intersect the PMOS diffusion region as well. Referring again to FIG. 1A, a PMOS transistor P5 having a source connected to a power supply node and drain connected to the second plate of the shared capacitor C is thus "free" in that it does not require any additional poly line but instead may share the poly line for the corresponding reset transistor N5. Transistor P5 is useful in other modes for bitcells 105 and 110. For example, transistor P5 may be used as a reset high mode of operation or as part of a capacitive digital-to-analog converter within a successive approximation analog-to-digital converter. A gate node for transistor P5 may be denoted as MRP. A corresponding MRP gate poly region for transistor P5 is shown in FIG. 1C for bitcell 105 in poly line 1 and in bitcell 110 in poly line 10.

Since a shared capacitor C is used, its metal plates may occupy all (or a portion) of the die space occupied by both bitcell 105 and bitcell 110. This is advantageous in that the poly pitch (and hence die space) for each bitcell may continue to shrink as more and more advanced process nodes are used yet there is sufficient die space for the metal plates (the first and second plates) of the shared capacitor C.

Figure 2A:
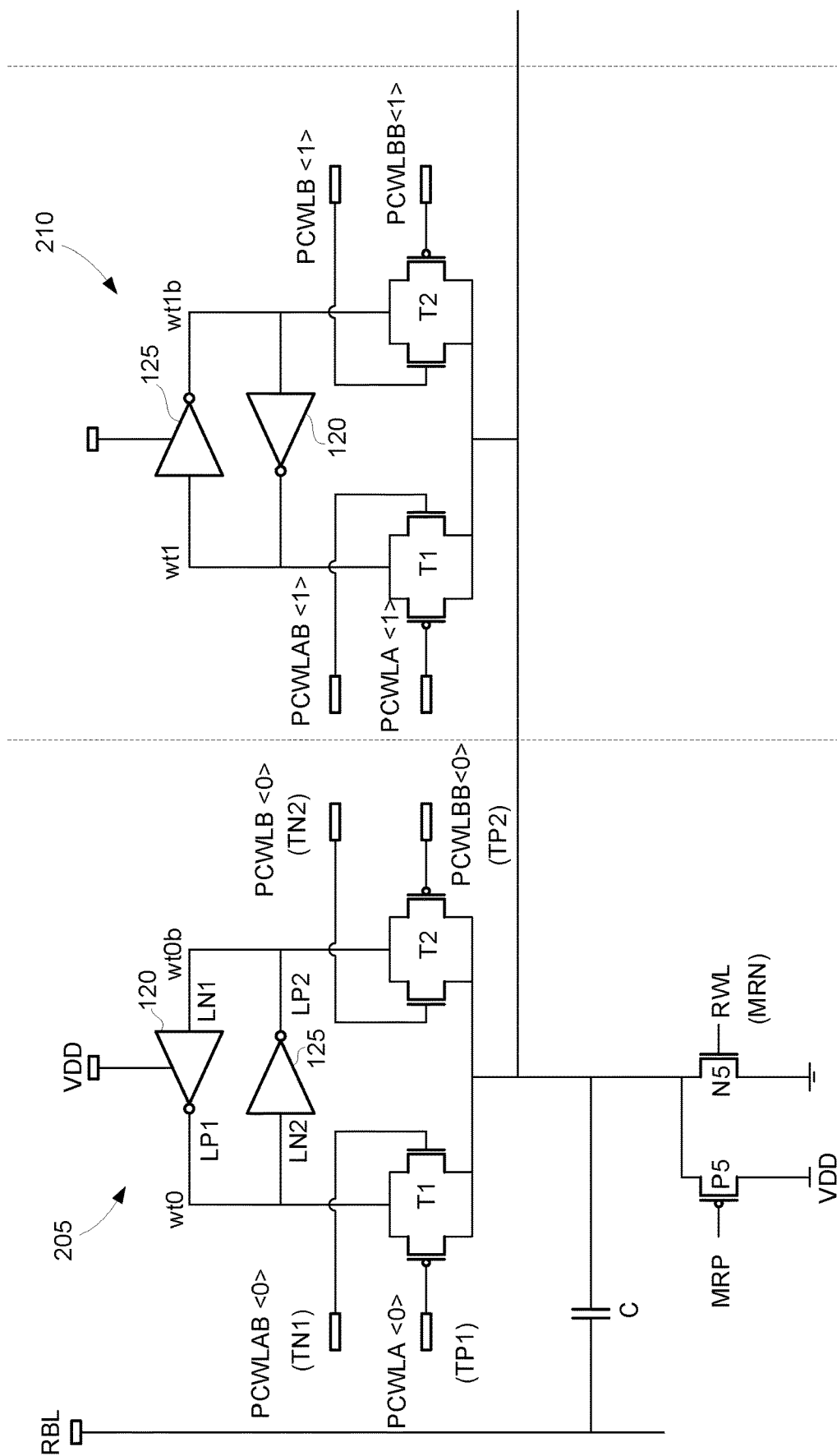
FIG. 2A illustrates a first pair of compute-in memory bitcells in a four-bitcell array time sharing a shared capacitor in accordance with an aspect of the disclosure.
Figure 2B:
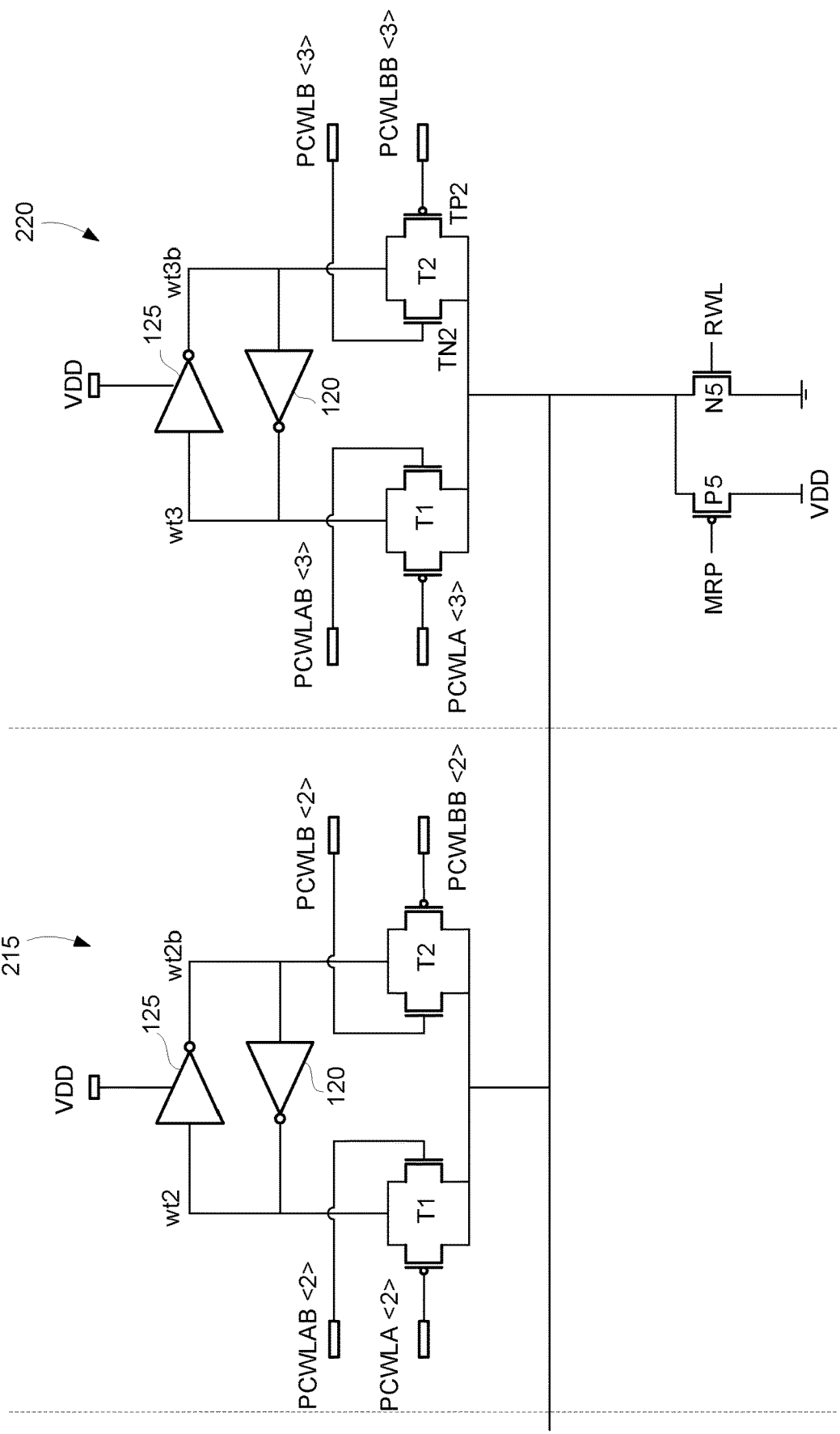
FIG. 2B illustrates a second compute-in-memory bitcell in the four-bitcell array of FIG. 2A in accordance with an aspect of the disclosure.
Figure 2C:
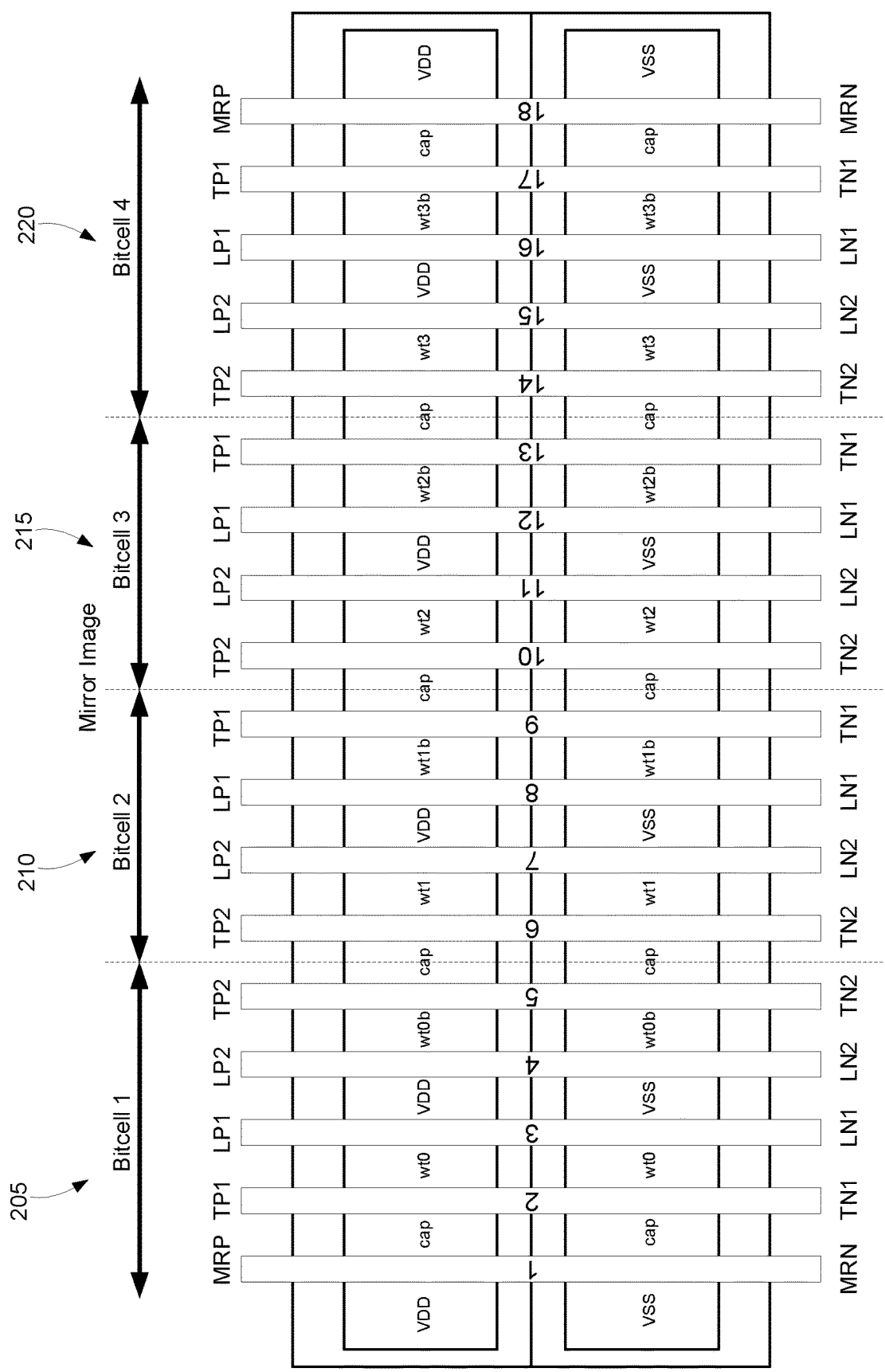
FIG. 2C illustrates a semiconductor layout for the first pair of compute-in-memory bitcells of FIG. 2A and for the second pair of compute-in-memory bitcells of FIG. 2B in accordance with an aspect of the disclosure in accordance with an aspect of the disclosure.

The time sharing of a shared capacitor C may be practiced by a greater plurality of bitcells. Although this increases latency since each bitcell gets its own calculation phase and accumulation phase, the inclusion of more than two bitcells increases density such that the ideal four-poly pitch for a conventional 6T SRAM bitcell is approached. For example, a four bitcell combination may be formed that includes a first bitcell 205 and a second bitcell 210 as shown in FIG. 2A and that includes a third bitcell 215 and a fourth bitcell 220 as shown in FIG. 2B. A zeroth activation bit controls a set of pre-charge word lines for first bitcell 205. Similarly, a first activation bit, a second activation bit, and a third activation bit control the pre-charge word lines for second bitcell 210, third bitcell 215, and fourth bitcell 220, respectively. First bitcell 205 is arranged as discussed for bitcell 105. Similarly, fourth bitcell 220 is arranged as discussed for bitcell 110. First bitcell 205 and fourth bitcell 220 thus each includes five poly lines as shown in the layout view of FIG. 2C. But second bitcell 210 and third bitcell 215 do not include a reset transistor N5 nor include a corresponding transistor P5. There is thus no need for a fifth poly line in either of these bitcells such that second bitcell 210 and third bitcell 215 each includes just four poly lines for the implementation of corresponding transistors P1, N1, P2, N2, P3, N3, P4, and N4 as discussed analogously with regard to FIG. 1C. The average ratio of the poly lines per bitcell for such a four bitcell combination is thus eighteen divided by four, which equals 4.5. To generalize from such a four bitcell combination, note that the intervening bitcells from the first bitcell to the last bitcell will each include only four poly lines. In an eight-bitcell combination (not illustrated), the average ratio of the number of poly lines per bitcell is thus 34/8, which is 4.25. It may thus be seen that as the number of bitcells in a combination is increased, the density becomes more and more like the density of a six-transistor conventional SRAM bitcell (four poly lines per bitcell). For example, a sixteen-bitcell combination provides an average ratio of 4.125 poly lines per bitcell. Regardless of the number N of bitcells that time share the shared capacitor C, it can be shown that the read bit line voltage that results from the calculations across the bitcells is the same as would be accomplished if all the bitcells had their own capacitor having a capacitance that is 1/Nth the capacitance of the shared capacitor C.

Figure 3:
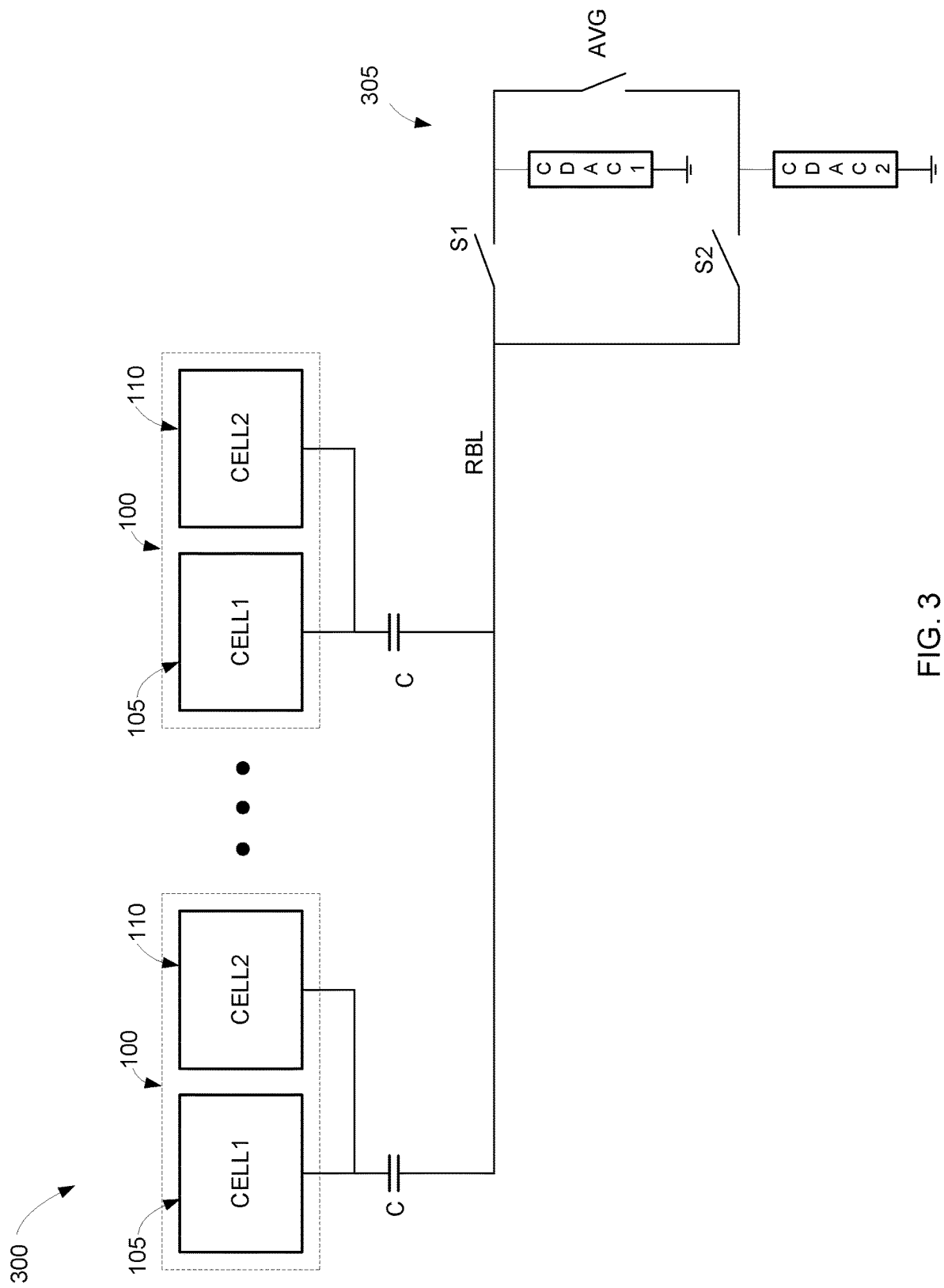
FIG. 3 illustrates a column of time-shared compute-in-memory bitcells and a corresponding analog-to-digital converter in accordance with an aspect of the disclosure.

In an array of bitcells as disclosed herein that is organized into rows and columns, each column of bitcells may share a read bit line. If there are a plurality of N columns, there would thus be a plurality of N read bit lines, one for each column. The activation bits are arranged by rows in such an array. An example column 300 of bitcells for an array is shown in FIG. 3 (note that column 300 is shown arranged in a row direction for illustration clarity). In column 300, the bitcells are arranged in pairs 100 that each share a shared capacitor C as discussed with regard to FIG. 1A. In a first calculation phase, bitcells 105 in each pair 100 perform their bit multiplication. The resulting charge on the read bit line is sampled by a first capacitive digital-to-analog converter (CDAC1) through a switch S1. In a second calculation phase, bitcells 110 in each pair 100 perform their bit multiplication. The resulting charge on the read bit line is then sampled by a second CDAC (CDAC2) through a switch S2. An averaging switch (AVG) between the CDAC1 and CDAC2 may then be closed to average the sampled charges. CDAC1 and CDAC2 are part of a successive-approximation-register analog-to-digital converter 305 that then converts the averaged charge into a digital value that represents a summation of a multiplication of the activation bits for column 300 with the corresponding stored weight bits.

A flowchart for an example compute-in-memory method is shown in FIG. 4. The method includes an act 400 of, in a first bitcell, controlling a first pair of transmission gates to drive a second plate of a shared capacitor with a first multiplication signal responsive to a first multiplication of a first input bit with a first stored bit, the shared capacitor having a first plate connected to a read bit line. The control of transmission gates T1 and T2 in bitcell 105 by the zeroth activation bit so that a multiplication signal may drive the second plate of the shared capacitor C is an example of act 400.

The method also includes an act 405 of sampling a first charge of the read bit line while grounding the second plate of the shared capacitor after the first multiplication to provide a first sampled charge of the read bit line. The sampling of the read bit line charge by CDAC1 is an example of act 405.

In addition, the method includes an act 410 of, in a second bitcell, controlling a second pair of transmission gates to drive the second plate of the shared capacitor with a second multiplication signal responsive to a second multiplication of a second input bit with a second stored bit. The control of transmission gates T1 and T2 in bitcell 110 by the first activation bit so that another multiplication signal may drive the second plate of the shared capacitor C is an example of act 410.

Finally, the method includes an act 415 of sampling a second charge of the read bit line while grounding the second plate of the shared capacitor after the second multiplication with the second stored bit to provide a second sampled charge of the read bit line. The sampling of the read bit line charge by CDAC2 is an example of act 415.

Figure 5:
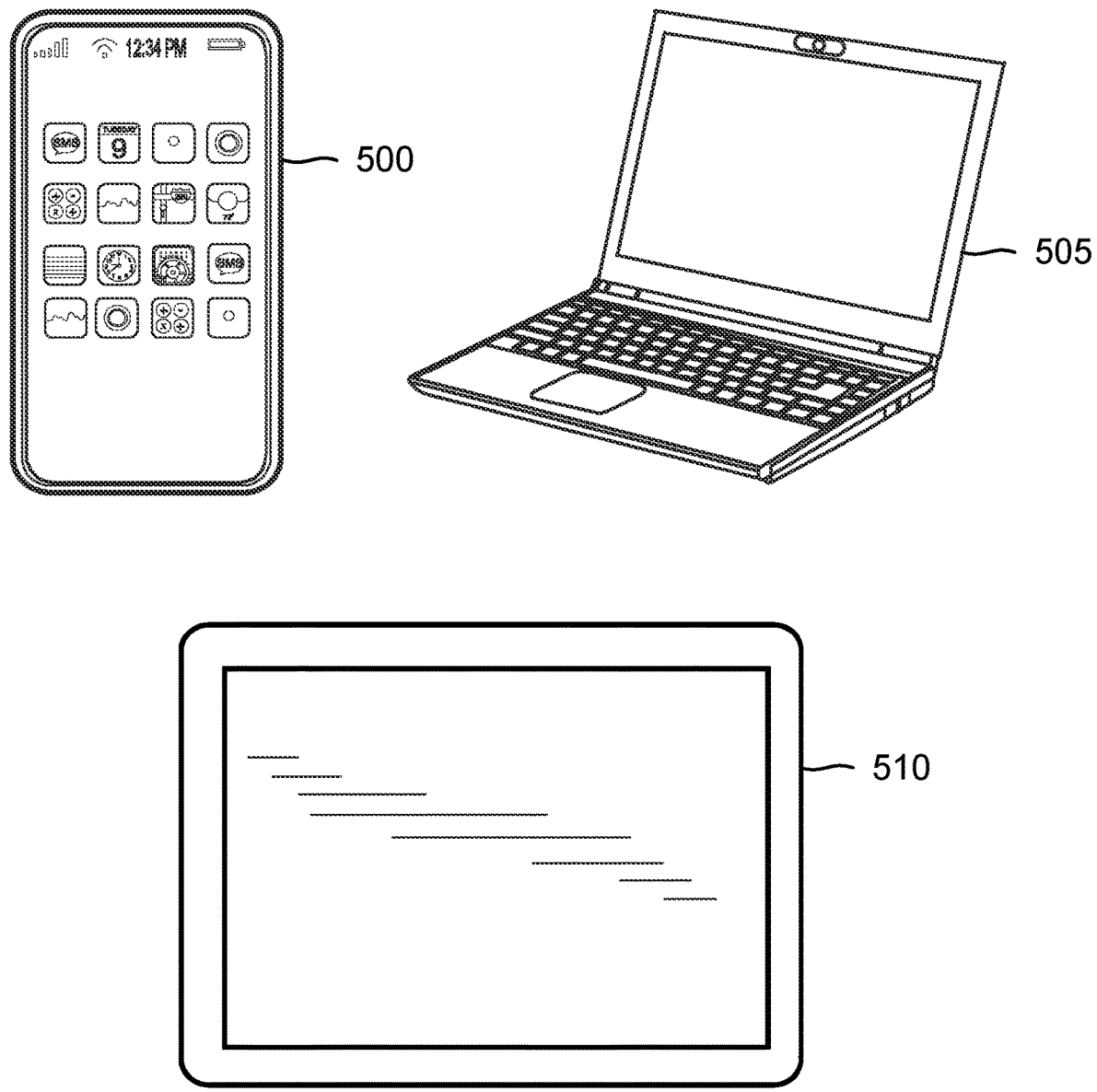
FIG. 5 illustrates some example electronic systems each incorporating an array of compute-in-memory bitcells in accordance with an aspect of the disclosure.

A compute-in-memory bitcell with a shared capacitor as disclosed herein may be advantageously incorporated in any suitable mobile device or electronic system. For example, as shown in FIG. 5, a cellular telephone 500, a laptop computer 505, and a tablet PC 510 may all include a compute-in-memory having compute-in-memory bitcells such as for machine learning applications in accordance with the disclosure. Other exemplary electronic systems such as a music player, a video player, a communication device, and a personal computer may also be configured with compute-in-memories constructed in accordance with the disclosure.

It will be appreciated that many modifications, substitutions and variations can be made in and to the materials, apparatus, configurations and methods of use of the devices of the present disclosure without departing from the scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

I claim:

1. A compute-in-memory bitcell array, comprising:
    a read bit line;
    a shared capacitor having a first plate connected to the read bit line;
    a first compute-in-memory bitcell that includes a first pair of cross-coupled inverters having a first output node for a first stored bit and includes a first transmission gate connected between the first output node and a second plate of the shared capacitor, the first transmission gate being configured to close in response to a first input bit being true and to open in response to the first input bit being false; and
    a second compute-in-memory bitcell that includes a second pair of cross-coupled inverters having a second output node for a second stored bit and includes a second transmission gate connected between the second output node and the second plate of the shared capacitor, the second transmission gate being configured to close in response to a second input bit being true and to open in response to the second input bit being false.

2. The compute-in-memory bitcell array of claim 1, wherein the first pair of cross-coupled inverters includes a third output node for a complement of the first stored bit and the first compute-in-memory bitcell further includes a third transmission gate connected between the third output node and the second plate of the shared capacitor, the third transmission gate being configured to open in response to the first input bit being true and to close in response to the first input bit being false.

3. The compute-in-memory bitcell array of claim 2, wherein the second pair of cross-coupled inverters includes a fourth output node for a complement of the second stored bit and the second compute-in-memory bitcell further includes a fourth transmission gate connected between the fourth output node and the second plate of the shared capacitor, the fourth transmission gate being configured to open in response to the second input bit being true and to close in response to the second input bit being false.

4. The compute-in-memory bitcell array of claim 1, wherein the first compute-in-memory bitcell further includes:
    a first reset n-type metal-oxide semiconductor (NMOS) transistor connected between ground and the second plate of the shared capacitor; and
    a first p-type metal-oxide semiconductor (PMOS) transistor connected between the second plate of the shared capacitor and a power supply node for a power supply voltage.

5. The compute-in-memory bitcell array of claim 4, wherein the second compute-in-memory bitcell further includes:
    a second reset NMOS transistor connected between ground and the second plate of the shared capacitor; and
    a second PMOS transistor connected between the second plate of the shared capacitor and the power supply node.

6. The compute-in-memory bitcell array of claim 5, wherein the compute-in-memory array is integrated onto a semiconductor substrate, the first compute-in-memory bitcell being integrated onto a first portion of the semiconductor substrate spanning a first set of five polysilicon lines, the second compute-in-memory bitcell being integrated onto a second portion of the semiconductor substrate spanning a second set of five polysilicon lines.

7. The compute-in-memory bitcell array of claim 6, further comprising:
a third compute in-memory bitcell that includes a third pair of cross-coupled inverters having a third output node for a third stored bit and includes a third transmission gate connected between the third output node and the second plate of the shared capacitor, the third transmission gate being configured to close in response to a third input bit being true and to open in response to the third input bit being false.

8. The compute-in-memory bitcell array of claim 7, further comprising:
a fourth compute in-memory bitcell that includes a fourth pair of cross-coupled inverters having a fourth output node for a fourth stored bit and includes a fourth transmission gate connected between the fourth output node and the second plate of the shared capacitor, the fourth transmission gate being configured to close in response to a fourth input bit being true and to open in response to the fourth input bit being false.

9. The compute-in-memory bitcell array of claim 8, wherein:
the third compute-in-memory bitcell is integrated onto a third portion of the semiconductor substrate spanning a first set of four polysilicon lines and the second compute-in-memory bitcell is integrated onto a fourth portion of the semiconductor substrate spanning a second set of four polysilicon lines.

10. The compute-in-memory bitcell array of claim 1, wherein the compute-in-memory array is integrated into a machine-learning application.

11. The compute-in-memory bitcell array of claim 10, wherein the machine-learning application is integrated within a cellular telephone.

12. The compute-in-memory bitcell array of claim 1, further comprising:
a reset switch connected between the read bit line and a power supply node for a power supply voltage.

13. The compute-in-memory bitcell array of claim 12, wherein the first compute-in-memory bitcell and the second compute-in-memory bitcell are arranged into a column of the compute-in-memory bitcell array, and wherein the read bit line extends across the column.

14. The compute-in-memory bitcell array of claim 1, further comprising:
an analog-to-digital converter configured to convert a voltage of the read bit line into a digital word representing a summation of a first multiplication of the first stored bit with the first input bit and a second multiplication of the second stored bit with the second input bit.

15. The compute-in-memory array of claim 14, wherein the analog-to-digital converter is a successive-approximation-register analog-to-digital converter.

16. A compute-in-memory method, comprising:
in a first bitcell, controlling a first pair of transmission gates to drive a second plate of a shared capacitor with a first multiplication signal responsive to a first multiplication of a first input bit with a first stored bit, the shared capacitor having a first plate connected to a read bit line;
sampling a first charge of the read bit line while grounding the second plate of the shared capacitor after the first multiplication to provide a first sampled charge of the read bit line;
in a second bitcell, controlling a second pair of transmission gates to drive the second plate of the shared capacitor with a second multiplication signal responsive to a second multiplication of a second input bit with a second stored bit; and
sampling a second charge of the read bit line while grounding the second plate of the shared capacitor after the second multiplication to provide a second sampled charge of the read bit line.

17. The compute-in-memory method of claim 16, further comprising:
averaging the first sampled charge of the read bit line with the second sampled charge of the read bit line to provide an averaged charge of the read bit line.

18. The compute-in-memory method of claim 17, further comprising;
converting the averaged charge of the read bit line into a digital word representing a summation of the first multiplication with the second multiplication.

19. The compute-in-memory method of claim 16, further comprising:
in a third bitcell, controlling a third pair of transmission gates to drive the second plate of a shared capacitor with a third multiplication signal responsive to a third multiplication of a third input bit with a third stored bit; and
sampling a third charge of the read bit line while grounding the second plate of the shared capacitor after the third multiplication to provide a third sampled charge of the read bit line.

20. The compute-in-memory method of claim 19, further comprising:
in a fourth bitcell, controlling a fourth pair of transmission gates to drive the second plate of a shared capacitor with a fourth multiplication signal responsive to a fourth multiplication of a fourth input bit with a fourth stored bit; and
sampling a fourth charge of the read bit line while grounding the second plate of the shared capacitor after the fourth multiplication to provide a fourth sampled charge of the read bit line.

21. The compute-in-memory method of claim 16, further comprising:
performing the first multiplication using an exclusive-not-OR (XNOR) logical operation in the first bitcell.

22. The compute-in-memory method of claim 16, further comprising:
performing the first multiplication using an exclusive-OR (XOR) logical operation in the first bitcell.

23. A compute-in-memory array, comprising:
a read bit line;
a first shared capacitor having a first plate connected to the read bit line;
a second shared capacitor having a first plate connected to the read bit line;
a first set of compute-in-memory bitcells, each compute-in-memory bitcell in the first set of compute-in-memory bitcells having a first capacitor node connected to a second plate of the first shared capacitor; and
a second set of compute-in-memory bitcells, each compute-in-memory bitcell in the second set of computein-memory bitcells having a second capacitor node connected to a second plate of the second shared capacitor.

24. The compute-in-memory array of claim 23, wherein each compute-in-memory bitcell in the first set of compute-in-memory bitcells comprises:
   a first inverter cross-coupled with a second inverter;
   a first transmission gate connected between a first output node of the first inverter and the first capacitor node; and
   a second transmission gate connected between a second output node of the second inverter and the first capacitor node.

* * * * *